United States Patent [19]

LeNir et al.

[11] Patent Number: 4,794,339

[45] Date of Patent: Dec. 27, 1988

[54] METHOD AND APPARATUS FOR ELECTRICALLY TESTING TELECOMMUNICATIONS CABLES

[75] Inventors: Victor L. LeNir, Montreal West; Jean-Marc Roberge, Kirkland; Paul Valois, Oka, all of Canada

[73] Assignee: Northern Telecom Limited, Montreal, Canada

[21] Appl. No.: 793,944

[22] Filed: Nov. 1, 1985

[51] Int. Cl.$^4$ .................... G01R 19/00; G01R 31/02
[52] U.S. Cl. ........................................ 324/540; 324/66
[58] Field of Search .................. 324/51, 52, 54, 66, 324/158 F, 150 P

[56] References Cited

U.S. PATENT DOCUMENTS

| | | | |
|---|---|---|---|
| 3,986,106 | 10/1976 | Shuck et al. | 324/66 |
| 4,038,501 | 7/1977 | Volk | 324/66 |
| 4,527,119 | 7/1985 | Rogers et al. | 324/158 F |

Primary Examiner—Reinhard J. Eisenzopf
Assistant Examiner—Walter E. Snow
Attorney, Agent, or Firm—R. J. Austin

[57] ABSTRACT

Testing of conductors of a telecommunications cable in which, after stripping cable material surrounding one end of the core, the conductors in the end are separated from one another and are embedded within a dielectric material. The dielectric material is initially flowable and is caused to fill spaces between the conductors. After hardening, the dielectric material forms a solid mass with conductor end portions embedded within it. A planar end face is then formed on the solid mass with the electrically isolated conductor ends terminating at the end face. An electrically conductive probe is then moved successively into contact with exposed conductor ends to pass an electrical current to be passed into the ends to enable measurements to be taken of any desired electrical property.

4 Claims, 2 Drawing Sheets

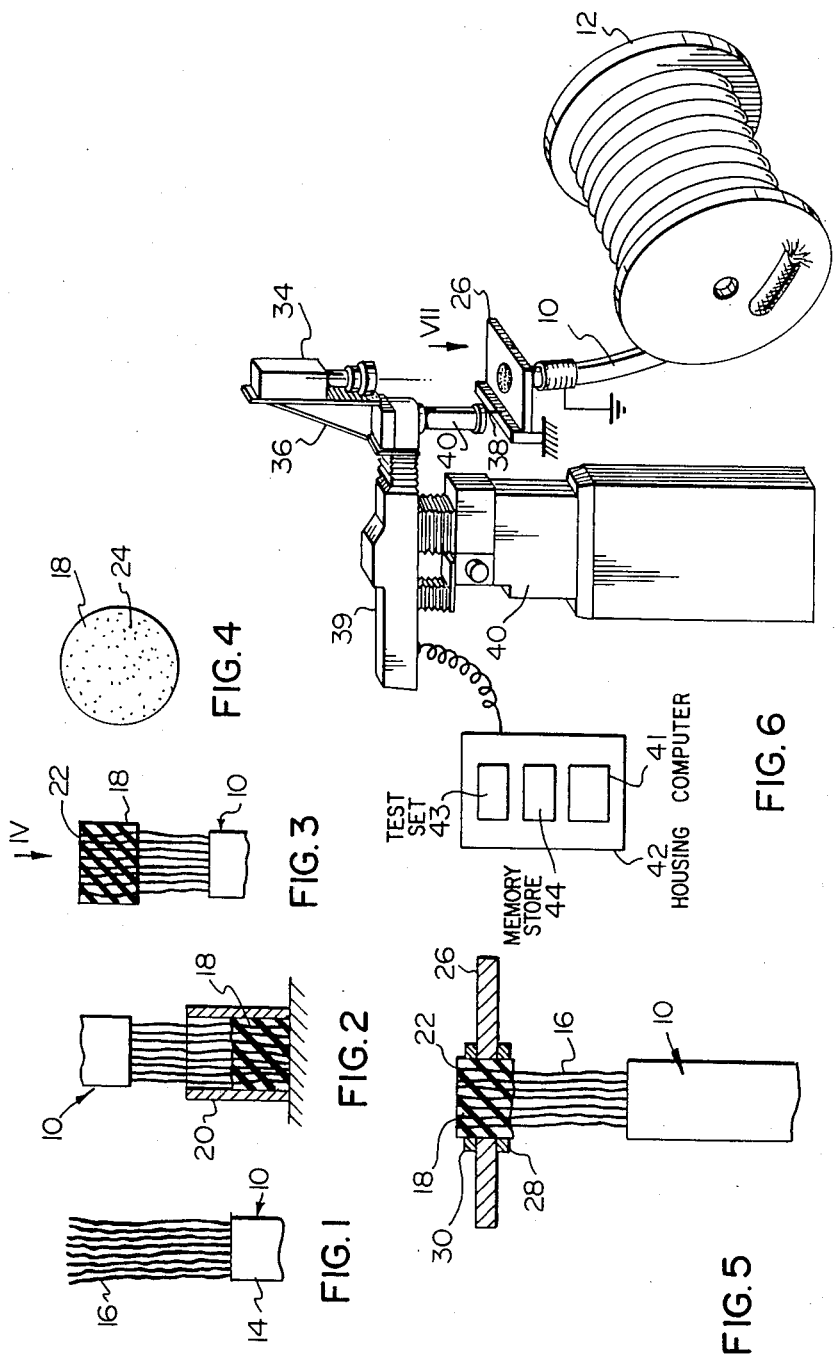

METHOD AND APPARATUS FOR ELECTRICALLY TESTING TELECOMMUNICATIONS CABLES

This invention relates to methods and apparatus for electrically testing telecommunications cables.

In the conventional testing of a telecommunications cable after manufacture, a tedious and lengthy procedure needs to be followed. For instance in testing a pulp cable, every single conductor pair is tested to determine whether there are any electrical shorts between each wire and any other wire of the cable or any breakage in any wire. The test required for this is performed in two stages. In a first stage, at one end of the cable all the electrical conductors are electrically isolated from each other. At the other end of the cable the wires are electrically connected to each other. Then each individual wire is removed from this cmmmon connection and is placed exteriorly of the cable in an electrical circuit in which the wire is connected in series with the common connection of all the other wires. In such a test, if the particular wire being tested is electrically shorted with any other wire inside the cable then a current will energize the circuit which has been provided and a signal, such as a bell, will indicate that a short has been found. Such a test procedure is particularly lengthy especially in the case where the cable has for instance up to 3600 pairs of insulated conductors in the core. In the second stage of this test, the conductors at one end of the cable are electrically connected together and each wire at the other end of the cable is separated out sequentially from the core and is connected by an electrical circuit to the common shorted connection at the far end of the cable. In this particular stage of the test, a current should pass through the circuit if the particular wire being tested is continuous from end-to-end of the cable. Again such a test takes an intolerable amount of time.

The present invention is concerned with a method of testing conductors of a telecommunications cable and also with an apparatus to enable the method to be used and in which a complete cable may be tested, not only for faults, but also for its characteristics in a much shorter period of time. The method of the invention is concerned with testing electrical cable and involves the holding of the conductor ends at one end of the cable in fixed relative positions and electrically isolated from one another and of then passing an electrical current through a probe and into each conductor in turn to enable the value of any desired electrical property to be measured. In this invention, to enable the conductor ends to be held in their fixed relative positions, the conductor end portions are embedded in a solid mass of material and some of the material is then removed to form a planar end face with the conductor ends terminating and exposed at this end face.

Accordingly, the present invention provides a method of electrically testing conductors of a telecommunications cable having a cable core which comprises a plurality of individually insulated electrical conductors in which the method comprises providing the core with one end which is stripped of surrounding cable material, with the insulated conductor ends at said one end separated from one another, causing a flowing hardenable dielectric material to fill spaces between the conductors, hardening the material to form a solid mass in which conductor end portions are embedded in fixed relative positions and are electrically isolated from one another, removing some of the hardened material and part of each conductor end portion, to provide a planar end face of the solid mass with the electrically isolated conductor ends terminating at and exposed at the end face, and sequentially contacting the exposed ends of conductors to be tested with an electrically conductive probe, passing an electrical current through the probe and into any conductor which it contacts, and measuring the value of a desired electrical property as the current passes along the conductor.

With the method according to the invention, time is initially saved because it is not necessary to separate individual conductors or pairs of conductors from the core material sequentially and by a manual process as is normally the case. Instead, and by the method of the present invention, the conductors are held with spaces between them so that a probe is movable across the end face for measurement purposes. To enable the probe to be moved in a constructive fashion and for the purpose of performing a test as quickly as possible, the method preferably comprises forming the solid mass from a material which reflects light at a different intensity from that of the conductor ends and after providing the planar end face, monitoring the light reflected from it. In the preferred method, this monitored light is then converted into signals in which the light signals for the conductor ends differ from those for the solid mass, and these signals are stored in a memory. The probe is then moved, dependent upon the stored signals, from one conductor position to another automatically so as to contact sequentially, each conductor to be tested. Thus the preferred method avoids any manual tedium for the testing process.

The invention includes apparatus for the electrical testing of conductors of a telecommunications cable which comprises means for embedding conductor ends at one end of a cable core in spaced relationship within a solid mass of dielectric material, a work station for holding said one end of cable core and the solid mass in fixed position after a planar end face has been provided in the solid mass at the core end, probe means movable into positions to contact exposed ends of conductors at the planar end face, the probe means connectable to a source of electrical potential, and control means for moving the probe means into contact with the exposed ends of the conductors.

In a preferred form, the apparatus includes means for monitoring light reflected from the planar end face and for converting it to electrical signals, memory means for storing the signals, the control means movable dependently upon the stored signals to move the energy transmitting means into said positions.

One embodiment of the invention will now be described by way of example with reference to the accompanying drawings in which:

FIG. 1 is a side elevational view of an electrical telecommunications cable end showing the conductor and shield removed to expose conductor end portions of the core;

FIGS. 2 and 3 are partly in cross-section and show stages in the preparation of the end of the cable by the addition of a solid mass of hardened material;

FIG. 4 is a view in the direction of arrow IV in FIG. 3;

FIG. 5 is partly in cross-section and shows the completed end of cable held in a work station in preparation for a testing operation;

FIG. 6 is on a smaller scale and is an isometric view of test equipment and showing the complete cable with the cable end held in position as shown in FIG. 5;

Figure 7:
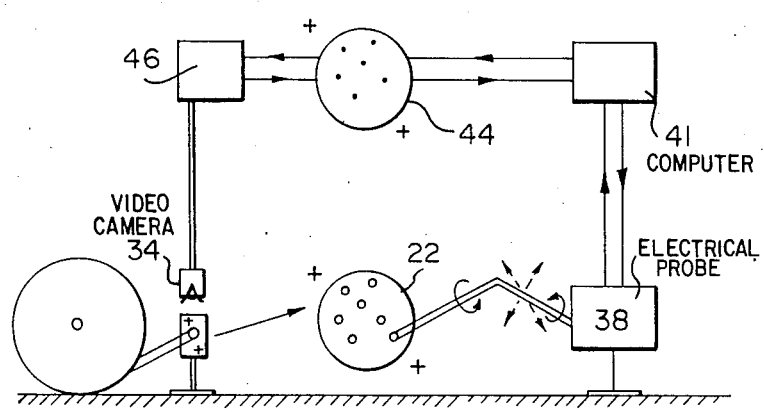
FIG. 7 is a diagrammatic representation or block diagram of a control means.

As shown in FIG. 1, a cable 10 which is carried upon a reel 12 (FIG. 6) has its outer coiled end prepared for testing. This preparation involves the removal of the cable jacket and sheath 14 to expose end portions 16 of the insulated electrical conductors of the cable core. Sufficient jacket and sheath should be removed to enable the test procedure to take place. Upon removal of the jacket and sheath and of any other material surrounding the core such as a core wrap (not shown), the conductor end portions tend to spring away from each other as shown in FIG. 1 so that the twisted together pairs of conductors become separated. These separated pairs are then embedded within a solid mass of hardened material 18 as shown in FIG. 2. The solid mass is molded into position around the conductor end portions with a molten epoxy resin material or other fast curing compound. To localize the solid mass around the conductors, a simple mold is provided in the form of a container 20 which may be split to remove it from the molded mass. This is placed on the ground, the molten epoxy resin material poured into it, and the conductor end portions inserted into the container to be immersed in the material as shown by FIG. 2, thereby providing a seal with the jacket to prevent or restrain the flowing resin from flowing along the jacket.

Upon setting of the resin and removal of the container 20, the conductor ends are all embedded within the solid mass. A planar end face 22 is then provided upon the solid mass as shown by FIG. 3. This end face is formed by a simple cutting or grinding operation and is produced at such a level down the mass so as to also grind all of the conductor ends whereby they terminate at and are exposed at the end face. This is shown clearly by FIG. 3 and also in FIG. 4 where the end surfaces 24 of the conductors are indicated. As can be seen from FIG. 4, the conductor ends are likely to occur at any random position at the end surface of the solid mass.

The cable mounted upon its reel is then located with the outer end held in a work station, i.e. in an aperture in a work table 26. As shown by FIG. 5, to hold the mass securely in position so that the conductors are all held not only in fixed relative positions isolated from one another but also fixed relative to the testing apparatus now to be described, the jacket and the solid mass are both held by a clamping arrangement in the work table. As shown by FIG. 5, this involves a clamp 28 surrounding the jacket at a position beneath the table and also a clamp 30 disposed above the table to hold the end of the solid mass which projects through the table orifice. In its clamped position, the insulated conductors without surrounding jacket and sheath extend for a suitable distance beneath the table to enable specific faulty conductors to be located upon a fault being found during a test operation as will be described.

The testing apparatus also comprises a video camera 34 which is disposed above the table 26 and is directed downwardly towards it. The camera is mounted upon a bracket 36 which also carries an electromagnetic energy transmitting contact member in the form of an electrical probe 38 which projects from a housing 40. Control means is provided for moving the camera and the bracket together across the table 26. This control means comprises a robot mechanism 39, the housing for which is shown and which is movable upon a stand 40. As shown by FIGS. 6 and 7, the control means also comprises a computer 41 retained in a housing 42 together with a test set 43 for making measurements and a signal or memory store 44 which is connected to the camera 34 through an analog to digital converter 46 to receive signals corresponding to the intensity of light picked up by the camera which thus provides a means for monitoring light reflected from the planar end face of the solid mass. Light is directed at the end face of the mass from a light source not shown. The computer is operably connected to the robot mechanism 39 for controlling its movement dependent upon the signals received from the memory.

In use of the test apparatus, in order to enable the camera position, the electrical probe position and thus the position of conductor ends in the solid mass to be determined, a grid 50 is secured to any suitable position upon the table 26 (FIG. 7). This grid has a plurality of points 52 which reflect light at a different intensity from the background of the grid. The camera and the probe 38 are then moved across the grid to determine base line positions with which positions on the surface 22 will then be referenced. This determination is done by locating the probe at each of three of the points 52. The positions of these points are then stored in the memory to provide a system of coordinates, i.e. x and y axes, appropriate to the probe 38. The camera is then positioned to locate each of the same three points 52. Signals are fed from the camera through the converter 46 to the memory 44, these signals corresponding to the intensity of light received from the grid and also received from the points 52 thereby enabling the two axes x and y extending between certain points 52 to be determined appropriate to the camera position and held in the memory. Once these positions have been determined as described, then the positions of the probe and camera after they have been moved from the grid are monitored by the computer. Also the position of any feature identified by light received by the camera may be determined by a comparison of new camera signals with those of the memory representing the x and y axes.

Figure 8:
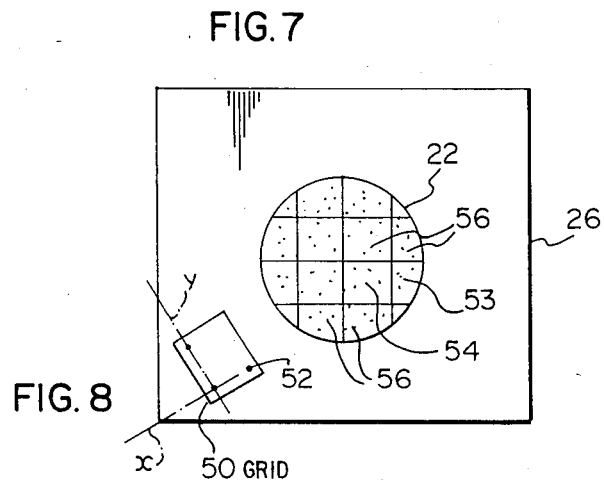
FIG. 8 is on a larger scale and is a view in the direction of arrow VII in FIG. 6 showing diagrammatically the systematic testing of regions at the end of the cable.

After the x and y axes have been located in position in the memory, the robot 39 is commanded to move the camera across the table to a position directly above the planar end face 22 and the small areas of the end face are dealt with systematically and in order. The camera is focused upon a small area of the end face (say for instance that identified by item 53 in FIG. 8). The light intensity received from this small area by the camera is sent as analog signals to the converter 46 and then into the memory as digital signals wherein it is stored for use when controlling movement of the probe across the area 53. The signals received by the memory for the solid mass of material itself differ from those received from the conductor ends, because the reflected light from the conductor ends is different from that of the black solid mass. The memory then compares the signals for the conductor ends with the positions for the axes x and y. The computer then controls the movement of the probe from the information stored in the memory concerning the conductor positions relative to the x and y axes which are related to both the camera and probe positions. The robot mechanism 39 is moved intermittently to position the probe sequentially directly above each of the conductor ends. When above each conductor end, the probe is moved into contact with the conductor end for passing a current through it. Thus, each conductor end is dealt with in the particular frame of reference, i.e. the area 53. After the area 53 has been dealt with by the probe, then the camera moves to the next area, for instance area 54 and the same procedure is followed, i.e. signals are stored in the memory relating to the positions of the conductors with regard to the axes x and y and the probe is then moved controllably over each of these positions so as to pass a current through each of the conductors in turn. This process is then continued by moving the camera across the end face 22 as shown by the other areas 56 in FIG. 8 until the whole of the end face 22 has been covered and all of the conductors have been tested.

The total process which has been described above including the removal of the jacket sheath, formation of the solid mass and the testing of each individual conductor is exceedingly short as compared to a standard testing operation. For instance, it has been found that after the jacket and sheath material has been removed, a period of about 15 minutes is required for molding, about 60 minutes is required for the epoxy resin to harden and to be ground down to provide the end face. In addition to this, the probe is moved from wire to wire at a speed of about 3 wires per second during one testing operation which is performed to determine whether an electrical short has been produced between any conductor and any other conductor. Thus, for a cable having 3600 pairs of conductors, this total operation takes around 40 minutes compared to a conventional test for indicating electrical pathways between conductors and which normally takes about 4 hours.

Figure 9:
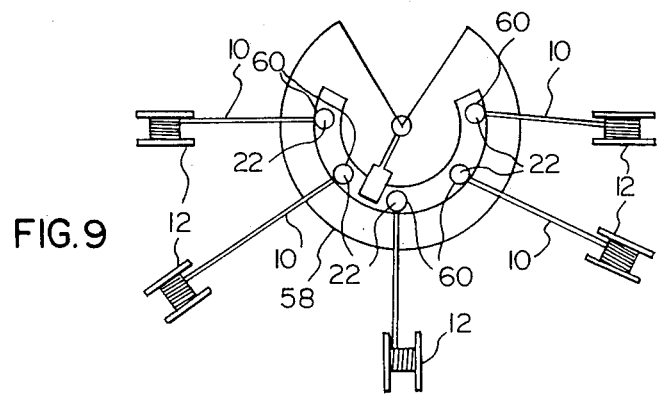
FIG. 9 is a plan view of a modification of the equipment of FIG. 6.

The process may be accelerated by preparing succeeding cables for testing while one cable is being tested. This is indicated by FIG. 9 in which the robot mechanism is disposed substantially on the center of an arcuate table 58 in which a plurality i.e. five, work stations 60 are provided. FIG. 9 shows the camera being traversed across one of these work stations while the other work stations are being made ready for test purposes. In each of these other stations, previously prepared cables 10 are already disposed for testing, and each of the cables has already been formed with its solid mass at an outer cable end and with its planar end face 22 which is already held securely in position in the work station in a similar way to that shown by FIG. 5. Hence the total test time for individual cables is reduced substantially because of this overlap of operations.

The following test procedure may be performed upon the apparatus described above, the test being done in two stages as will be described.

Test - Stage 1

In this stage, all the wires are maintained insulated from one another at both ends of the cable. The probe is moved in controlled fashion across the end face 22 as described above and current is passed through the probe to each conductor as it lies in contact with it and the cable sheath is connected to ground, possibly at the far end of the cable. The capacitance of each conductor to the shield is measured. It is known that under normal circumstances for a completely isolated conductor, that the capacitance should lie between certain values. However, if there is electrical contact between one conductor and another along the length of the cable, then the capacitance to shield is drastically different from that of other conductors thereby indicating that at least two conductors, and not one, are producing the capacitance to the shield. Hence current must be passing through two conductors instead of merely the one which is connected to the probe. To enable any faulty conductor to be located on this test, an indicating device is used manually upon the exposed insulated conductors beneath the table 26. The procedure for identifying the particular conductor concerned is a simple and relatively short process in that groups of conductors are tested by the indicating device to locate the special group containing the conductor through which the current is being passed. This group is then subdivided into smaller groups and these smaller groups are tested until the appropriate conductor is found. By this process of elimination, the faulty conductor is discovered within a few minutes. Upon the conductor being discovered, it is marked appropriately with a tag so that repair of the cable may be made subsequent to the testing procedure.

Test - Stage 2

In this test stage, the conductors at one end of the cable are shorted to ground or to each other. The probe is then passed under robot control across the end face 22 at the other end of the cable and passes current, in turn, into each conductor. The resistance to the current is then measured to determine for any wire breakage. As resistance may be affected by the pressure of any probe upon a conductor and also upon the conductor temperature, inductance is also measured, because from inductance a more accurate resistance may be determined. Any differences in inductance from what should be expected will indicate a broken conductor.

What is claimed is:

1. A method of electrically testing conductors of a telecommunications cable having a cable core comprising a plurality of individually insulated electrical conductors in which the method comprises:

providing the core with one end which is stripped of surrounding cable material;

separating the conductor ends from one another at said one end of the core;

causing a flowing hardenable dielectric material to fill spaces between the separated conductors;

hardening the material to form a solid mass in which the conductor end portions are embedded in fixed relative positions and are electrically isolated from one another, the solid mass reflecting light at a different intensity from that of the conductor ends;

removing some of the hardened material and part of each conductor end portion to provide a planar end face of the solid mass with the eletrically isolated conductor ends terminating at and exposed at said end face;

directing light at the end face and monitoring light reflected from the end face;

converting the monitored light into signals in which light signals from the conductor ends differ from those for the solid mass and storing the signals in a memory; and subsequently contacting the exposed ends of conductors to be tested with a single electrically conductive probe while moving the probe, dependent upon the stored signals, from conductor to conductor so as to contact sequentially each conductor to be tested, passing an electrical current through the probe and into any conductor which it contacts, and measuring the value of a desired electrical property as the current passes along said conductor.

2. A method according to claim 1 wherein the cable has a shield surrounding the core in which the method comprises grounding the shield and, with a conductor electrically isolated from all other conductors, passing the current through the conductor and measuring the capacitance of said conductor to the shield to indicate any electrical short between said conductor and any other conductor.

3. A method according to claim 1 comprising connecting the opposite end of the cable to ground, passing the current into a conductor at said one end and measuring the resistance to ground to indicate any electrical short between said conductor and any other conductor.

4. A method of testing conductors of a plurality of telecommunications cables each having a cable core comprising a plurality of individually insulated electrical conductors comprising testing the cables according to claim 1 in succession in which one cable is located in a work station with exposed ends of said one cable being contacted by the probe, while a succeeding cable is having its solid mass of material prepared and its planar end face provided and is then being located in another work station.

* * * * *